(12) United States Patent
Gupta et al.

(10) Patent No.: US 12,068,701 B2
(45) Date of Patent: Aug. 20, 2024

(54) SELF-TUNING PIEZOELECTRIC VIBRATION ENERGY HARVESTER

(71) Applicants: Rishi Gupta, Victoria (CA); Sreekumari Raghavan, Victoria (CA)

(72) Inventors: Rishi Gupta, Victoria (CA); Sreekumari Raghavan, Victoria (CA)

(73) Assignee: UVic Industry Partnerships Inc., Victoria (CA)

( * ) Notice: Subject to any disclaimer, the term of this patent is extended or adjusted under 35 U.S.C. 154(b) by 557 days.

(21) Appl. No.: 17/102,285

(22) Filed: Nov. 23, 2020

(65) Prior Publication Data

US 2021/0159816 A1     May 27, 2021

Related U.S. Application Data

(60) Provisional application No. 62/939,511, filed on Nov. 22, 2019.

(51) Int. Cl.
| | | |
|---|---|---|
| *H02N 2/18* | (2006.01) | |
| *H10N 30/00* | (2023.01) | |
| *H10N 30/30* | (2023.01) | |
| *H10N 30/80* | (2023.01) | |
| *H10N 30/85* | (2023.01) | |

(52) U.S. Cl.
CPC ............ *H02N 2/188* (2013.01); *H02N 2/181* (2013.01); *H10N 30/1061* (2023.02); *H10N 30/306* (2023.02); *H10N 30/802* (2023.02); *H10N 30/852* (2023.02)

(58) Field of Classification Search
CPC ...... H02N 2/188; H02N 2/181; H10N 30/306; H01L 41/113; H01L 41/1136

USPC .......................................................... 310/339
See application file for complete search history.

(56) References Cited

U.S. PATENT DOCUMENTS

| | | | |
|---|---|---|---|
| 7,365,455 | B2 | 4/2008 | Hamel et al. |
| 10,355,623 | B1* | 7/2019 | Yavid .................... H10N 30/30 |
| 2010/0060231 | A1 | 3/2010 | Trainor et al. |
| 2010/0102673 | A1 | 4/2010 | Leukkunen |
| 2014/0035438 | A1 | 2/2014 | Livermore-Clifford et al. |
| 2015/0180374 | A1 | 6/2015 | Herder et al. |
| 2020/0076331 | A1* | 3/2020 | Song .................... H10N 30/80 |
| 2020/0224637 | A1* | 7/2020 | Azadi Yazdi ............ F03D 5/06 |

OTHER PUBLICATIONS

Ahmed-Seddik et al., "Self-powered resonant frequency tuning for Piezoelectric Vibration Energy Harvesters," *Journal of Physics: Conference Series*, 476:1-5 (Dec. 2013).

Ai et al., "Piezoelectric vibration-based energy harvesting enhancement exploiting nonsmoothness," *Actuators*, vol. 8, 15 pages (Mar. 2019).

(Continued)

*Primary Examiner* — Derek J Rosenau
(74) *Attorney, Agent, or Firm* — Klarquist Sparkman, LLP

(57) ABSTRACT

Piezoelectric vibrational energy harvesters (PVEHs) include a Macro Fiber Composite (MFC)) piezoelectric transducer coupled to a cantilever to harvest vibrational energy. One or more Ionic Polymer Metal Composite (IPMC) strips are situated to provide device tuning over a wide frequency range by applying variable contact force to the cantilever. Power consumption for tuning is sufficiently low that the tuning actuator (IPMCs) can be powered using harvested energy.

32 Claims, 5 Drawing Sheets

(56) References Cited

OTHER PUBLICATIONS

Avvari et al., "Bandwidth enhancement of a piezoelectric energy harvester using parametrically induced vibrations," *ICAST 2014—25th International Conference on Adaptive Structures and Technologies*, 11 pages (Oct. 6-8, 2014).
Bouhedma et al., "Magnetic Frequency Tuning of a Multimodal Vibration Energy Harvester," *Sensors (Basel, Switzerland)*, 19(5), 14 pages (Mar. 2019).
Cetin et al., "A Flexible Piezoelectric Energy Harvesting System for Broadband and Low-frequency Vibrations," *Procedia Engineering*, 120:345-348 (Dec. 2015).
Challa et al., "Resonant frequency tunable vibration energy harvesting device," *Structural Health Monitoring 2007: Quantification, Validation, and Implementation—Proceedings of the 6th International Workshop on Structural Health Monitoring, IWSHM 2007*, 9 pages (Jan. 2007).
Chen et al., "A Control-Oriented and Physics-Based Model for Ionic Polymer—Metal Composite Actuators," *IEEE/ASME Transactions on Mechatronics*, 13(5):519-529 (Oct. 2008).
Dechant et al., "Bandwidth Widening of Piezoelectric Cantilever Beam Arrays by Mass-Tip Tuning for Low-Frequency Vibration Energy Harvesting," *Applied Sciences*, 7(1324), 16 pages (Dec. 2017).
Eichhorn et al., "A Frequency Tunable Piezoelectric Energy Converter Based on a Cantilever Beam," *Proceedings of PowerMEMS 2008*, pp. 309-312 (Nov. 9-12, 2008).
Eichhorn et al., "Bidirectional frequency tuning of a piezoelectric energy converter based on a cantilever beam," *Journal of Micromechanics and Microengineering*, 19(9), 6 pages (Aug. 2009).
Fan et al., "A monostable piezoelectric energy harvester for broadband low-level excitations," *Appl. Phys. Lett.*, 112:123901-1-123901-5 (Mar. 22, 2018).
Gibus et al., "Modelling and design of highly coupled piezoelectric energy harvesters for broadband applications," *Journal of Physics: Conference Series*, vol. 1407, 4 pages (Dec. 2018).
Gregg et al., "Passively Self-Tuning Piezoelectric Energy Harvesting System," *Journal of Physics: Conference Series*, vol. 557, 5 pages (Nov. 2014).
Hu et al., "An impact-engaged two-degrees-of-freedom Piezoelectric Energy Harvester for Wideband Operation," *ScienceDirect*, 173:1463-1470 (Jan. 2017).
Huang et al., "Design, analysis, and experimental studies of a novel PVDF-based piezoelectric energy harvester with beating mechanisms," *Sensors & Actuators: A. Physical*, 238:317-328 (2016).
Huang et al., "Wide-bandwidth piezoelectric energy harvester integrated with parylene-C beam structures," *Microelectronic Engineering*, 111:214-219 (2013).
Keshmiri et al., "A Wideband Piezoelectric Energy Harvester Design by Using Multiple Non-Uniform Bimorphs," *Vibration*, 1:93-104 (Aug. 2018).
Kim et al., "Ultra-wide bandwidth piezoelectric energy harvesting," *Applied Physics Letters*, 99:083105-083105-3 (Aug. 2011).
Koven et al., "Low-Frequency and Broadband Vibration Energy Harvesting Using Base-Mounted Piezoelectric Transducers," *IEEE Transactions on Ultrasonics, Ferroelectrics, and Frequency Control*, 64(11):1735-1743 (Nov. 2017).
Lallart et al., "Frequency Self-tuning Scheme for Broadband Vibration Energy Harvesting," *Journal of Intelligent Material Systems and Structures*, 21:897-906 (Jun. 2010).
Leadenham et al., "Nonlinear M-shaped broadband piezoelectric energy harvester for very low base accelerations: primary and secondary resonances," *Smart Materials and Structures*, vol. 24, 14 pages (Apr. 2015).
Leland et al., "Resonance tuning of piezoelectric vibration energy scavenging generators using compressive axial preload," *Smart Materials and Structures*, 15:1413-1420 (Sep. 2006).
Li et al., "Dual Resonant Structure for Energy Harvesting from Random Vibration Sources," *Proceedings of the 11th IEEE Annual International Conference on Nano/Micro Engineered and Molecular Systems*, 5 pages (Apr. 17-20, 2016).
Li et al., "Low-frequency and wideband vibration energy harvester with flexible frame and interdigital structure," *AIP Advances*, vol. 5, 8 pages (Apr. 2015).
Liu et al., "A multi-frequency piezoelectric vibration energy harvester with liquid filled container as the proof mass," *Applied Physics Letters*, 114:213902-213902-5 (May 2019).
Lu et al., "An E-Shape Broadband Piezoelectric Energy Harvester Induced by Magnets," *Journal of Intelligent Material Systems and Structures*, 29(11):2477-2491 (May 2018).
Maeguchi et al., "Band widening of piezoelectric vibration energy harvesters by utilizing mechanical stoppers and magnets," *Journal of Physics: Conference Series*, vol. 660, 5 pages (Dec. 2015).
Ma et al., "A Broadband Frequency Piezoelectric Vibration Energy Harvester," *Key Engineering Materials*, 483:626-630 (2011).
Ma et al., "Investigation on the design and application of 3-dimensional wide-band piezoelectric energy harvester for low amplitude vibration sources," *Smart Materials and Structures* (Aug. 2019).
Maeika et al., "Multifrequency Piezoelectric Energy Harvester Based on Polygon-Shaped Cantilever Array," *Shock and Vibration*, vol. 2018, 11 pages (Mar. 2018).
Qi et al., "Design of a multi resonant beam for broadband piezoelectric energy harvesting," *Smart Materials and Structures*, 19 (2010).
Sebald et al., "Experimental Duffing oscillator for broadband piezoelectric energy harvesting," *Smart Materials and Structures*, vol. 20, 10 pages (Sep. 2011).
"Smart Material," available at: https://www.smart-material.com/index.html, 2 pages, retrieved on Dec. 8, 2020.
Tan et al., "Broadband design of hybrid piezoelectric energy harvester," *International Journal of Mechanical Sciences*, 131-132:516-526 (Oct. 2017).
Wang et al. "Low-frequency, broadband piezoelectric vibration energy harvester with folded trapezoidal beam," *Review of Scientific Instruments*, 90:035001-1-035001-8 (Mar. 2019).
Wu et al., "A frequency adjustable vibration energy harvester," *Proceedings of Power MEMS*, Sendai, Japan (2008) (copy could not be located; explanation of pertinence in IDS accompanying this 1449).
Wu et al., "Multi-resonant wideband energy harvester based on a folded asymmetric M-shaped cantilever," *AIP Advances*, 5:077149-1-077419-7 (Jul. 2015).
Zayed et al., "Design Procedure and Experimental Verification of a Broadband Quad-Stable 2-DOF Vibration Energy Harvester," *Sensors*, 19(2893), 26 pages (Jun. 2019).
Zhang et al., "A tunable frequency up-conversion wideband piezoelectric vibration energy harvester for low-frequency variable environment using a novel impact- and rope-driven hybrid mechanism," pp. 26-34 (Apr. 2019).
Zhao et al., "Modeling and Experiment of a V-Shaped Piezoelectric Energy Harvester," *Shock and Vibration*, vol. 2018, 15 pages (May 2018).
Zhou et al., "A Novel Nonlinear Piezoelectric Energy Harvesting System Based on Linear-Element Coupling: Design, Modeling and Dynamic Analysis," *Sensors*, 18(1492), 19 pages (May 2018).
Zhou et al., "Impacts of stopper type and material on the broadband characteristics and performance of energy harvesters," *AIP Advances*, 9:035228-035228-6 (Mar. 2019).
Zhu et al., "Frequency Tuning of Vibration Energy Harvesters using Compressive and Tensile Axial Loads," *Energy* (2011).

\* cited by examiner

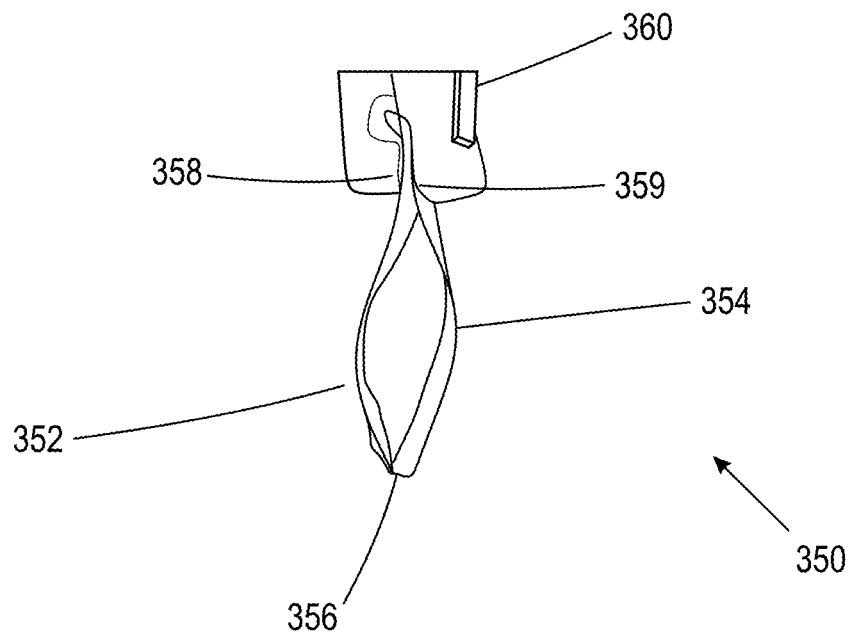
FIG. 3A
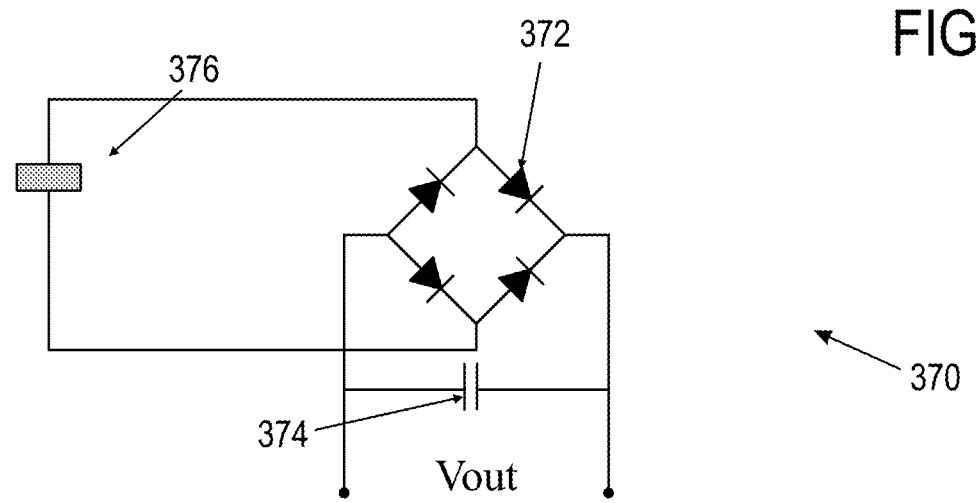
FIG. 3B
FIG. 3C  FIG. 3D
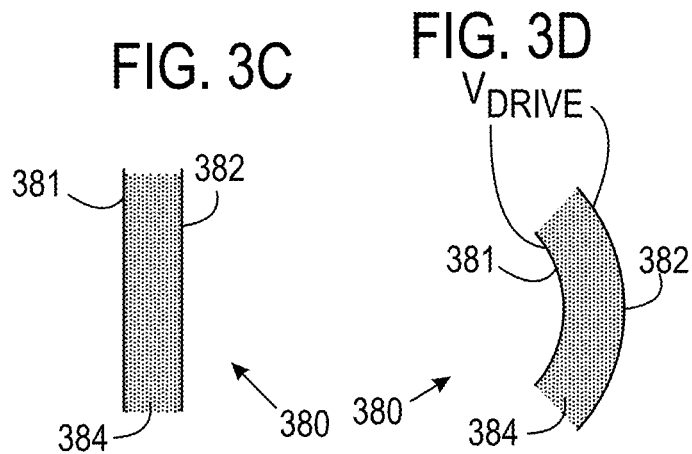

SELF-TUNING PIEZOELECTRIC VIBRATION ENERGY HARVESTER

CROSS REFERENCE TO RELATED APPLICATION

This application claims the benefit of U.S. Provisional Application No. 62/939,511, filed Nov. 22, 2019, which is hereby incorporated by reference in its entirety.

FIELD

The disclosure pertains to energy harvesting.

BACKGROUND

Harvesting electrical energy from mechanical vibrations has been attracting attention of researchers from various interdisciplinary fields, because of its wide range of applicability in various fields of science and technology, including providing autonomous power supply for health monitoring of critical structures. Many materials have been studied towards for this application and piezoelectric materials have been proven to be a good option. Piezoelectric Vibration Energy Harvesters (PVEH) are being developed with the goal of achieving a wider effective band width to improve harvesting efficiency. Some use However, none of the proposed PVEHs are satisfactory, and alternative approaches are needed.

SUMMARY

The disclosure pertains to PVEH devices that can use tuning of a resonant frequency of a novel design of PVEH at different amplitude values of input signals. In examples, the resonant frequency of the PVEH is electrically tuned using Ionic Polymer Metal Composites (IPMC). Actuation force associated with an IPMC is utilized for applying a required load on the cantilever of the energy harvester. A stacked IPMC can be used instead of a single unit. The stacked IPMC consists of two IPMCs, attached only at the ends and powered by a single supply.

Devices can comprise a cantilever and a piezoelectric transducer coupled to the cantilever to produce an electrical output signal in response to a vibration of the cantilever. An actuator is situated to variably contact the cantilever to establish a resonant frequency of the cantilever. The actuator can be one or more Ionic Polymer Metal Composite (IPMC) strips. In examples, the actuator is coupled to the cantilever to establish the resonant frequency based on a stiffness of the cantilever and an actuator driver coupled to the actuator to apply an electrical signal to the actuator to establish the resonant frequency of the cantilever. The cantilever can be a cantilever beam or a cantilever plate formed of, for example, stainless steel or aluminum. In some examples, a sensor circuit is coupled to the piezoelectric transducer to determine an electrical signal to be applied by an actuator driver to provide a predetermined output power from the piezoelectric transducer. In some examples, the sensor circuit is coupled to determine an available vibrational frequency. The actuator can be configured to adjust at least one of a cantilever stiffness or cantilever resonant frequency based on the available vibrational frequency. The cantilever can comprise a first cantilever section and a second cantilever section, wherein the first cantilever section is a base section and the second cantilever section is an extension section. The base section can be thicker than the extension section, and the base section and the extension section are secured at respective major surfaces or minor surfaces. The actuator can contact the base section or the extension section. In an example, the base section has a thickness of 0.64 mm and the extension section has a thickness of 0.37 mm, and the base section and the extension section are bonded to each other with an adhesive layer or welding at respective major surfaces. The piezoelectric transducer can be a macro fiber composite (MFC) transducer and can be bonded to a major surface of the cantilever over substantially an entire length and width of the major surface. The actuator can be situated to variably contact the cantilever in a central 80% of a cantilever length or area. A memory can store a plurality of actuator drive values and associated cantilever resonance frequencies or stiffnesses and a digital to analogy convertor coupled to the memory to apply a selected drive value to the actuator. In some examples, the actuator has a diamond shape and includes first and second actuators that are stacked.

In some examples, the actuator is a single layer ionic polymer metal fiber composite (MFCs) or a pair of such MFCs.

Methods comprise subjecting a cantilever to vibrations and contacting the cantilever at one or more locations or with one or more contact forces using an actuator. A resonant frequency of the cantilever is identified based on the vibrations for each of the one or more locations and/or each of the one or more contact force and an actuator drive value associated with the resonant frequency is stored for each of the one or more locations and/or each of the one or more contact forces. The vibrations can be applied as a series of single frequency vibrations. The resonant frequency for each of the one or more locations and/or each of the one or more contact forces can be determined based on an output of a piezoelectric transducer coupled to the cantilever.

Methods comprise subjecting a cantilever to vibrations and contacting the cantilever at one or more locations using an actuator. Based on coupling of the vibrations by the cantilever to a piezoelectric transducer, an actuator drive for one or more vibrational frequencies and associated with a selected piezoelectric transducer output power is determined.

Methods comprise contacting a cantilever using a actuator and adjusting the contact based on an output power from a transducer coupled to receive mechanical vibrations from the cantilever. In further examples, an electrical device is powered or charging an electrical storage device is charged based on a transducer output.

The foregoing and other features and advantages will become more apparent from the following detailed description, which proceeds with reference to the accompanying figures.

BRIEF DESCRIPTION OF THE DRAWINGS

FIG. 3A illustrates a representative configuration of two IPMC devices for use in frequency tuning a PVEH device.

FIG. 3B illustrates a representative rectifier circuit.

FIG. 3C illustrates a representative IPMC.

FIG. 3D illustrates the IPMC of FIG. 3C with an applied voltage.

DETAILED DESCRIPTION

Introduction

The disclosure pertains to piezoelectric vibration energy harvesters (PVEHs) and associated methods and devices. In typical examples, the disclosed devices are responsive at low frequencies such as less than 1 kHz, 500 Hz, 250 Hz, 100 Hz, 50 Hz, 25 Hz, 10 Hz, 5 Hz, 2.5 Hz, 1 Hz, or lower. The devices can be frequency tuned using power harvested by the devices. In examples, a representative PVEH integrates two smart materials, a piezoelectric material (such as a Macro Fiber Composite (MFC)) situated to harvest energy and an Ionic Polymer Metal Composite (IPMC) situated to provide device tuning over a wide frequency range.

MFCs consist of a piezoelectric sheet formed of piezoelectric fibers of square cross section which are bonded together. This piezoelectric sheet is placed between layers of adhesive, electrodes and a polyimide film. The electrodes are typically made in an interdigitated pattern to enable better contact with the fibers and in-plane poling/actuation. This pattern also helps in achieving low voltage drop at the interface. MFCs can be environmentally sealed and hence be non-porous. MFCs have advantages over other piezoelectric elements. MFCs are flexible and are thus suitable for PVEHs having high deflections. MFCs can be bonded to surfaces effectively and can provide energy conversion at their resonant frequencies when used in cantilever mode. However, output power drops at other vibration frequencies. In he disclosed examples, active tuning can be provided using IPMCs, which can be compact, have low mass, and required little power. IPMCs consist of a per fluorinated ion exchange membrane such as a Nafion membrane situated between two electrodes, typically metals or other conductors coated with a noble metal, gold or platinum. When subjected to low voltages (typically 1 to 4 V), positively charged hydrated cations in the Nafion membrane network are repelled by the anode and hence move to the negative electrode. The water molecules that are tagged to cations also move within the membrane. The resulting osmotic pressure gradient causes bending of IPMC strips with the direction of bending dependent on the polarity of the applied voltage. In addition to bending an IPMC, an applied voltage also increases IPMC stiffness. Both bending and stiffness changes in response to an applied voltage can be used vary a load supplied by an IPMC, In the examples, specific configurations of cantilevers are used for purposes of illustration but other cantilever configurations can be used. Cantilevers can have one fixed end and one free end only, or other combinations such as cantilevers in multiple directions, or cantilevers supported within the cantilever span, etc.

Example 1

Figure 1:
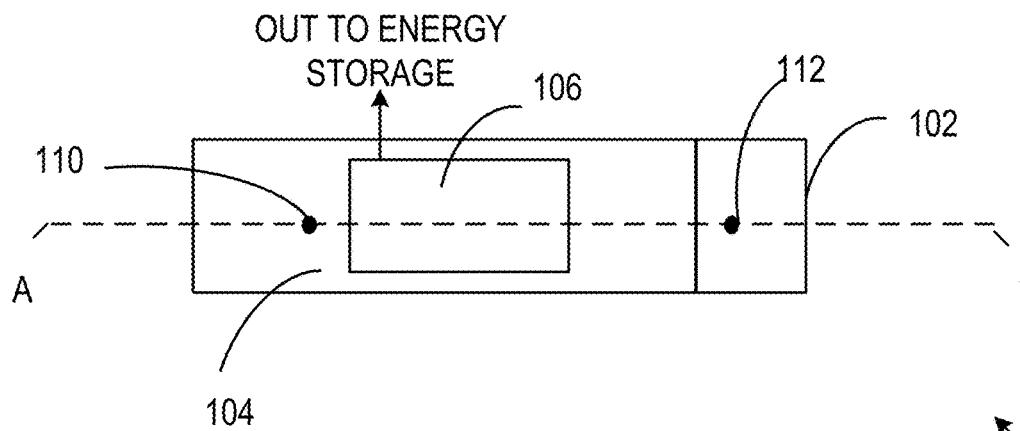
FIG. 1 is a plan view of a representative piezoelectric vibration energy harvester (PVEH) device.
Figure 1A:
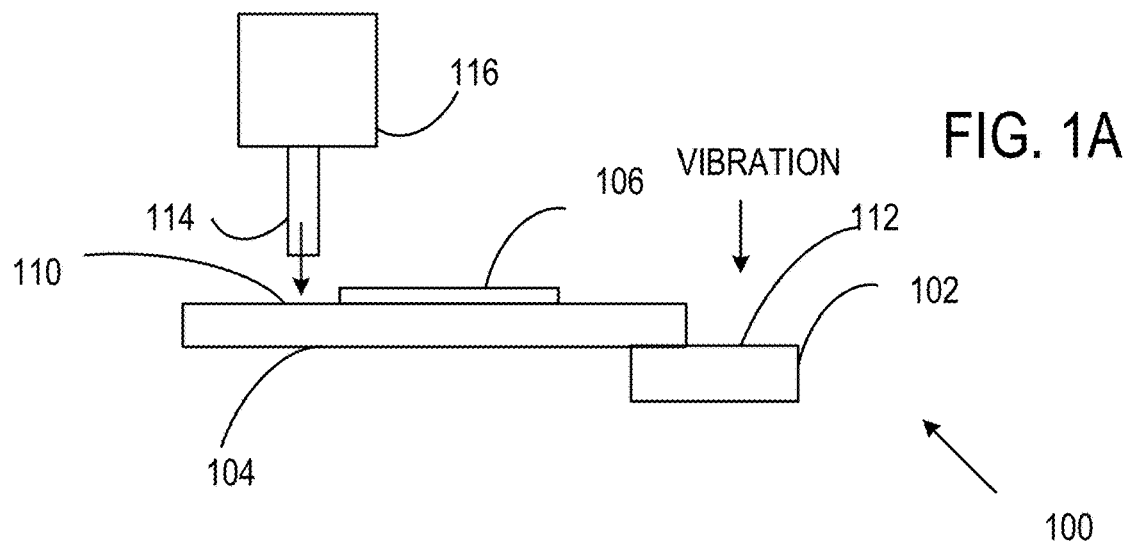
FIG. 1A is a sectional view of the PVEH device of FIG. 1.

Referring to FIGS. 1-1A, a PVEH device 100 includes a cantilever base 102 to which a cantilever 104 is secured. The cantilever 104 extends from the cantilever 102 and is generally thinner than the cantilever 104. An MFC 106 or other flexible piezoelectric transducer is secured to the cantilever 104. A location 110 on the cantilever 104 is designated for frequency response tuning based on loading applied to the location 110. For evaluation purposes, a location 112 is designed for the application of vibrational forces whose energy is to be harvested. In the sectional view of FIG. 1A, a tuning member 114 is coupled to a support member 116 and is situated to contact the cantilever 104 at the location 110 to tune a cantilever resonance frequency. In typical examples, the tuning member 114 includes one or more IPMCs that are coupled to electrical power source (a voltage source) such as an energy storage device to which the PVEH 100 delivers energy. In this way, harvested energy can be used for PVEH tuning.

Figure 4A:
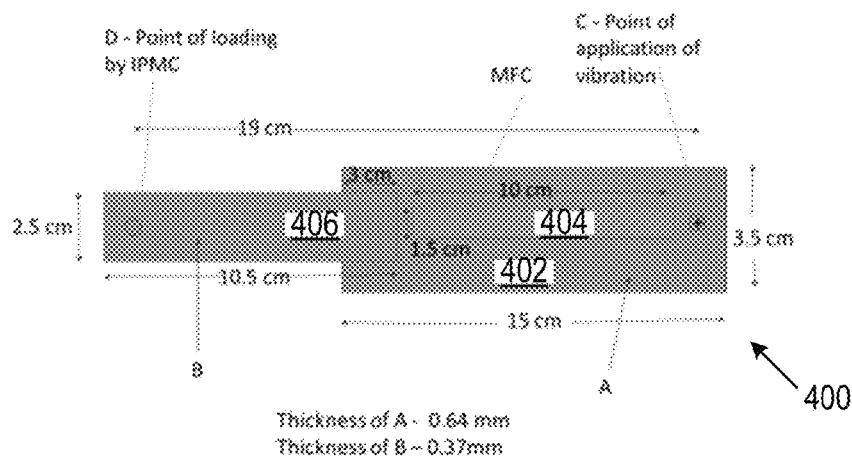
FIGS. 4A-4C are plan views of a representative PVEH devices with dimensions.
Figure 4B:
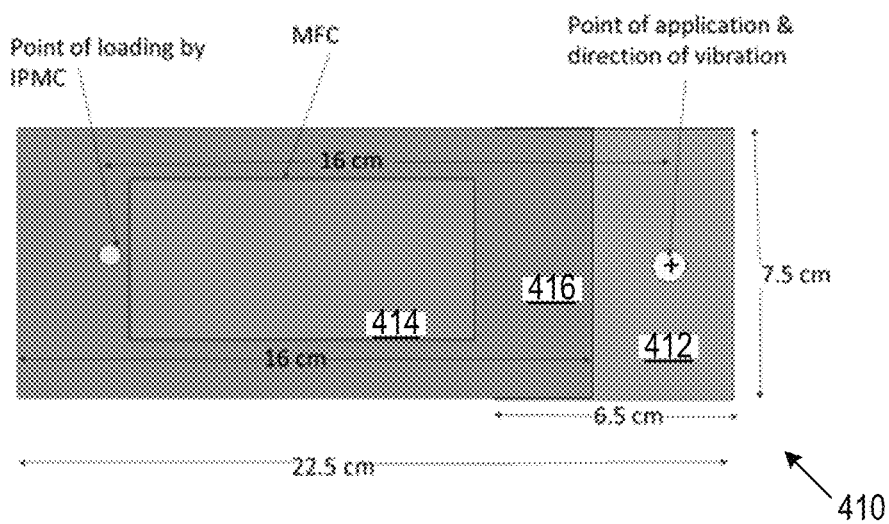

In one example, the cantilever 102 is 1 mm thick aluminum and the cantilever 104 is 0.5 mm thick stainless steel. Complete dimensions of such a device are shown in FIG. 4B. As shown, the MFC 106 is bonded to the thinner cantilever 104. The thicker cantilever base 104 generates higher strain.

Example 2

Figure 2:
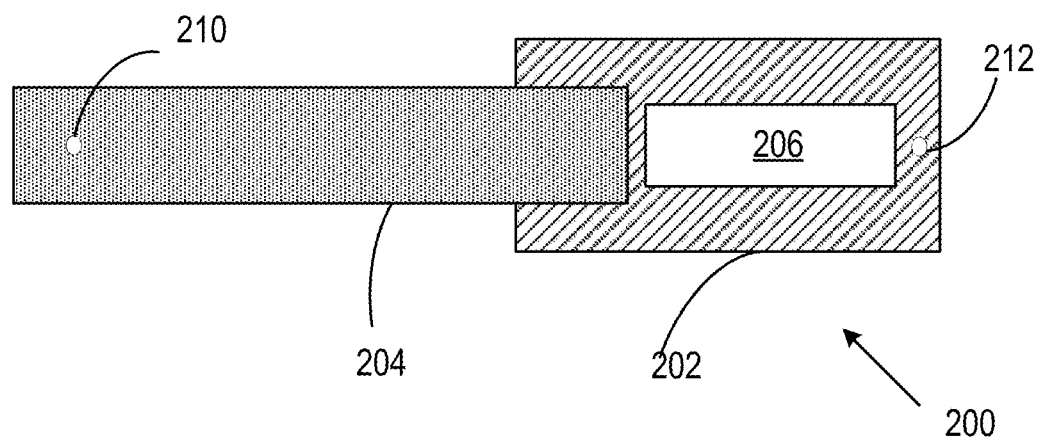
FIG. 2 is a plan view of another representative PVEH device.

Referring to FIG. 2, a representative PVEH device 200 includes a cantilever base 202 to which a cantilever 202 is bonded. An MFH 206 or other piezoelectric device is secured to the cantilever base 202. Preferred locations 210, 212 for loading for tuning and application of vibrations, respectively, are indicated, but other locations can be used. Dimensions of such a PVEH device are shown in FIG. 4A.

Example 3

Figure 3:
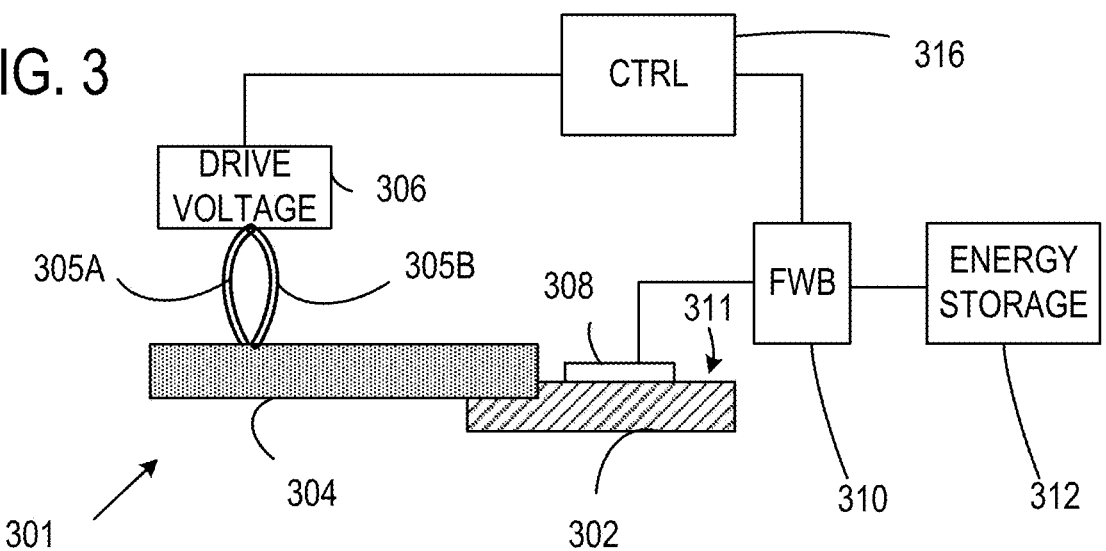
FIG. 3 illustrates a PVEH-based energy harvesting and calibration system.

Referring to FIG. 3, an energy harvesting system 300 includes a PVEH device 301 having a cantilever base 302 to which a cantilever 304 is secured. In this example, an MFH 308 is secured to the cantilever base 302 but in other examples, an MFH is secured to a cantilever instead of or in addition to a cantilever base. A tuning member 305 includes one or more IPMC devices such as IPMC devices 305A, 305B that are secured to each other at their ends. The tuning member 305 is coupled to a support 306 and is situated to contact the cantilever 304. Loading of the cantilever 304 can be varied based on a voltage or other electrical signal applied to the IPMC devices 305A, 305B and supplied by a control circuit 316. The MFH 308 is coupled to a full wave bridge (FWB) circuit 310 and rectified output from the MFH 308 is delivered to energy storage 312 such as a battery or capacitor. During setup or calibration, the control circuit 316 can be externally powered to vary loading provided by the IPMC devices 305A, 305B to the cantilever 304 while vibration is applied to the cantilever 302 at, for example, location 311. During energy harvesting the tuning load can be selected based on a voltage or other drive supplied by the FWB circuit 310 or the energy storage 312. In this case, the control circuit 316 can be a passive circuit. [resistive divider w voltage regulation). Typically, one or more rectifiers (such as the FWB circuit) are used to provide single polarity output for charging a capacitor or a battery, but energy storage can be based on bipolar output. A FWB is particularly useful for efficiency, but other arrangements of one or more rectifiers can be used.

FIG. 3A illustrates a representative tunable load member 305 that includes IPMCs 352, 354 that are coupled at a tip 356. A support member 360 secures ends 358, 359 of the IPMCs 352, 354, respectively, for application of a drive voltage that causes the IMPCs 352, 354 to bend so as to extend or contract.

FIG. 3B illustrates a circuit 370 that includes a full wave bridge (FWB) rectifier formed of diodes such as diode 372. The FWB is coupled to charge a capacitor 374 and to receive inputs voltages from a piezoelectric device 376.

FIG. 3C-3D illustrate a representative IPMC strip 380 having noble metal conductor layers 381, 382 that sandwich an ionic polymer membrane 384. If desired, additional electrical contacts can be formed on the conductor layer 381, 382 for electrical connection to a voltage source that provides a voltage $V_{DRIVE}$ that causes the IPMC strip 380 to deform as shown in FIG. 3D.

Example 4

Figure 4C:
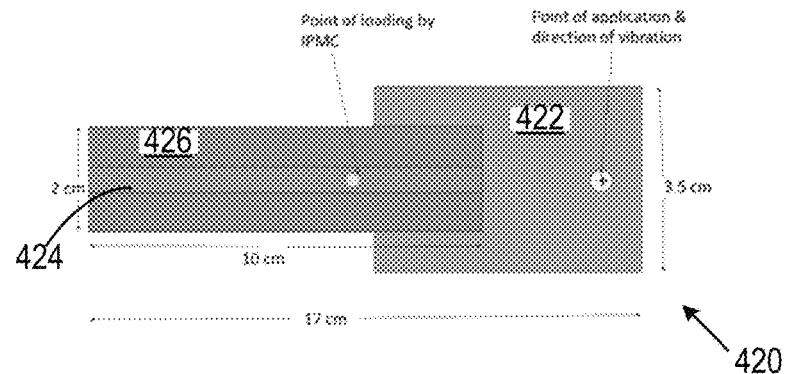

FIGS. 4A-4B illustrate representative examples of PVEH devices and shown typical dimensions. In FIG. 4A, a PVEH device 400 includes a cantilever base 402 to which a cantilever 406 is secured. An MFH 404 is bonded to the cantilever base 402. In FIG. 4B, a PVEH device 410 includes a cantilever base 412 to which a cantilever 416 is secured. An MFH 414 is bonded to the cantilever 412. In FIG. 4C, a PVEH device 420 includes a cantilever base 422 to which a cantilever 426 is secured. An MFH 424 is bonded to the cantilever 422. In FIGS. 4A-4C, preferred locations for loading for tuning and application of vibration are also shown.

Example 5

Figure 5:
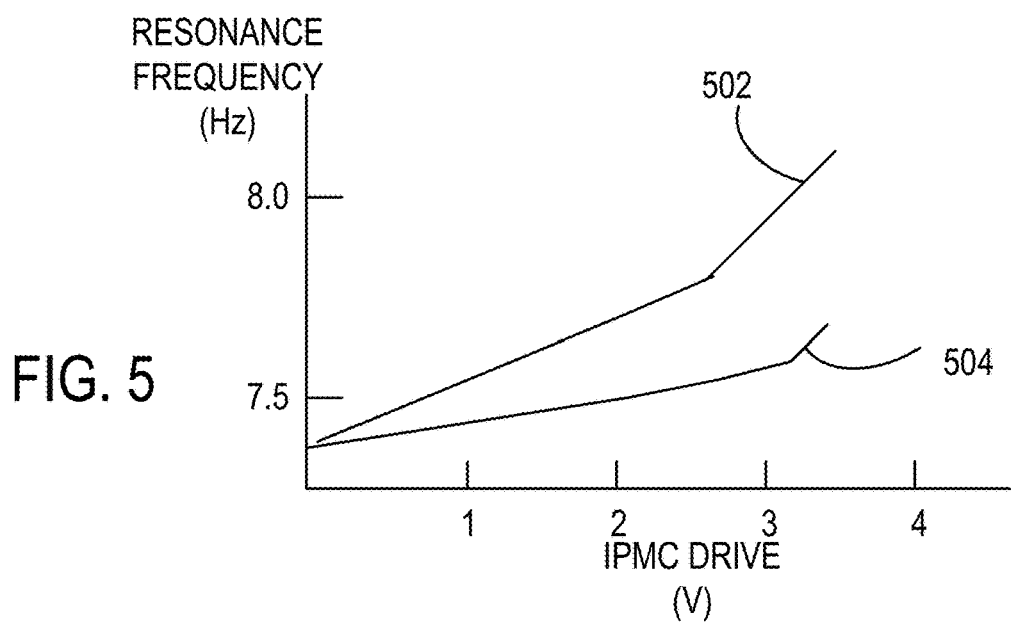
FIG. 5 illustrates resonance frequency of PVEH devices as a function of drive voltage to one or more IPMC devices.

FIG. 5 illustrates PVEH resonance frequency tuning by application of a voltage to IPMC devices that are situated to contact a PVEH cantilever. Curves 502, 504 illustrate tuning of two different device configurations and show that increased loading (i.e., larger voltages in this example) can increase resonance frequency. Such calibration curves can be used to select an operating load for a PVEH device and a control circuit can be configured to provide a suitable voltage using harvested energy if external energy sources are to be avoided. An external source can be used for tuning during harvesting. However, energy usage for tuning is preferably less than (or very much less than) energy harvested.

Example 6

Figure 6:
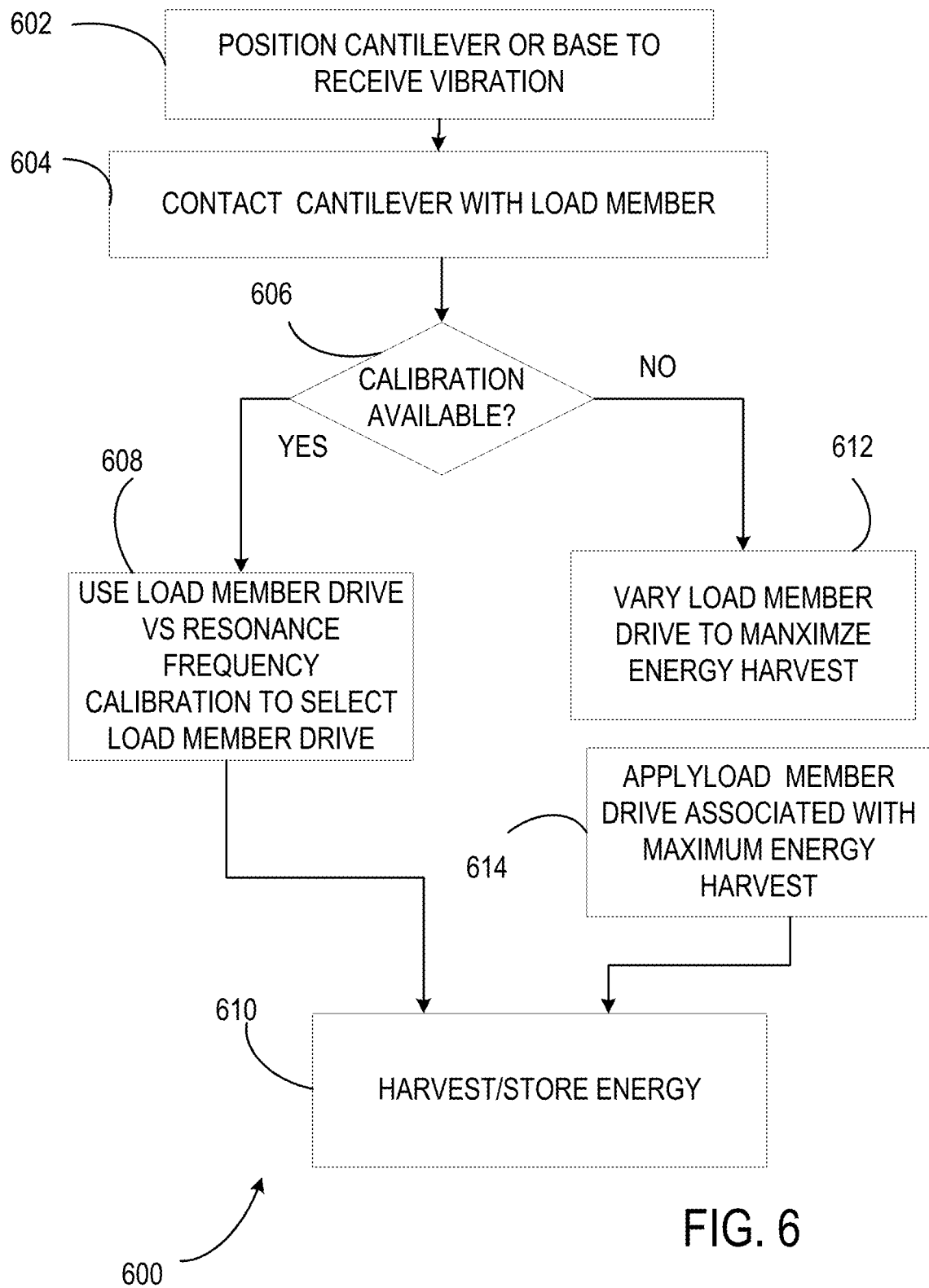
FIG. 6 illustrates a representative PVEH-based method.

With reference to FIG. 6, a representative method 600 includes positioning a cantilever or cantilever base to receive vibrations such as ambient vibrations at 602. At 604, the cantilever is contacted with a tunable load member. At 606, it is determined if load calibration is available. If so, at 606, calibration data of resonance frequency versus load member drive is used to select a load member drive, and at 610, the PVEH device is situated for harvesting energy. If calibration is unavailable at 606, load member drive is varied at 602 to determined preference values for energy harvesting. At 614, the load member drive associated with maximum or other preferred values of energy harvesting is applied and at 610, energy is harvested.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, are not limited not limited to such theories of operation.

The examples above are described with reference to particular piezoelectric devices, cantilever materials, circuit configurations, and material dimensions for convenience but the disclosure is not to be limited to the explanatory configurations. Loading of cantilevers is illustrated using IPMCs but other actuators can be used. The terms "major surface" and "minor surface" refer to surfaces having larges and smaller surface areas, respectively, and are intended to distinguish the edge surfaces of substrates from larger surfaces. Tuning members can include IPMCs or other devices, and actuator mechanisms such as IPMCs can contact cantilever elements directly or use additional components for contact.

In view of the many possible embodiments to which the principles of the disclosure may be applied, it should be recognized that the illustrated embodiments are only preferred example and should not be taken as limiting. We therefore claim as our invention all that comes within the scope and spirit of these claims.

We claim:

1. A device, comprising:
a cantilever;
a piezoelectric transducer coupled to the cantilever to produce an electrical output signal in response to a vibration of the cantilever; and
an actuator situated to variably contact the cantilever to vary a load supplied by the actuator to the cantilever through the contact, to establish a resonant frequency of the cantilever;
wherein the actuator is an Ionic Polymer Metal Composite (IPMC).

2. The device of claim 1, wherein the actuator is coupled to the cantilever to establish the resonant frequency based on a stiffness of the cantilever.

3. The device of claim 1, further comprising an actuator driver coupled to the actuator to apply an electrical signal to the actuator to establish the resonant frequency of the cantilever.

4. The device of claim 1, wherein the cantilever is a cantilever beam or a cantilever plate.

5. The device of claim 1, wherein the cantilever is stainless steel or aluminum.

6. The device of claim 1, further comprising a sensor circuit coupled to the piezoelectric transducer to determine an electrical signal to be applied by an actuator driver to provide a predetermined output power from the piezoelectric transducer.

7. The device of claim 6, wherein the sensor circuit is coupled to determine an available vibrational frequency.

8. The device of claim 7, wherein the actuator driver is configured to adjust at least one of a cantilever stiffness or cantilever resonant frequency based on the available vibrational frequency.

9. The device of claim 3, wherein the actuator driver is coupled to vary a cantilever resonance frequency or stiffness or both and select a resonance frequency or stiffness or both associated with a preferred output of the piezoelectric transducer.

10. The device of claim 1, wherein the cantilever comprises a first cantilever section and a second cantilever section.

11. The device of claim 10, where the first cantilever section is a base section and the second cantilever section is an extension section.

12. The device of claim 11, wherein the base section is thicker than the extension section, and the base section and the extension section are secured at respective major surfaces.

13. The device of claim 11, wherein the base section is thicker than the extension section, and the base section and the extension section are secured at respective minor surfaces.

14. The device of claim 11, wherein the actuator contacts the base section or the extension section.

15. The device of claim 11, wherein the base section has a thickness of 0.64 mm and the extension section has a thickness of 0.37 mm, and then base section and the extension section are bonded to each other with an adhesive layer or welding at respective major surfaces.

16. The device the of claim 1, wherein the piezoelectric transducer is a macro fiber composite (MFC) transducer.

17. The device of claim 16, wherein the MFC transducer is bonded to a major surface of the cantilever over substantially an entire length and width of the major surface.

18. The device of claim 1, wherein the actuator is situated to variably contact the cantilever in a central 80% of a cantilever length or area.

19. The device of claim 1, further comprising:
a memory storing a plurality of actuator drive values and associated cantilever resonance frequencies or stiffnesses; and
a digital to analogy convertor coupled to the memory to apply a selected drive value to the actuator.

20. The device of claim 1, wherein the actuator has a diamond shape and includes first and second actuators that are stacked.

21. The device of claim 1, wherein the actuator contacts the cantilever a distance of 16 cm from a point of application of a vibration.

22. The device of claim 1, wherein the actuator is a single layer ionic polymer metal fiber composite.

23. The device of claim 1, wherein the cantilever has one fixed end, one free, end, two fixed ends, two free ends, extends in two or more directions, or is supported within a cantilever span.

24. A method, comprising:
subjecting a cantilever to vibrations;
variably contacting the cantilever at one or more locations or with one or more contact forces using an Ionic Polymer Metal Composite (IPMC) actuator configured to vary a load supplied by the actuator to the cantilever through the contact and to establish a resonant frequency of the cantilever;
identifying the resonant frequency of the cantilever based on the vibrations for each of the one or more locations and/or each of the one or more contact forces; and
storing an actuator drive value associated with the resonant frequency for each of the one or more locations and/or each of the one or more contact forces.

25. The method of claim 24, wherein the vibrations are applied as a series of single frequency vibrations.

26. The method of claim 24, wherein the resonant frequency for each of the one or more locations and/or each of the one or more contact forces is determined based on an output of a piezoelectric transducer coupled to the cantilever.

27. A method, comprising:
subjecting a cantilever to vibrations;
variably contacting the cantilever at one or more locations using an Ionic Polymer Metal Composite (IPMC) actuator configured to vary a load supplied by the actuator to the cantilever through the contact and to establish a resonant frequency of the cantilever; and
based on coupling of the vibrations by the cantilever to a piezoelectric transducer, determining an actuator drive for one or more vibrational frequencies and associated with a selected piezoelectric transducer output power.

28. A method, comprising:
variably contacting a cantilever using an Ionic Polymer Metal Composite (IPMC) actuator configured to vary a load supplied by the actuator to the cantilever through the contact and to establish a resonant frequency of the cantilever; and
adjusting the contact based on an output power from a piezoelectric transducer coupled to receive mechanical vibrations from the cantilever.

29. The method of claim 28, further comprising powering an electrical device or charging an electrical storage device based on a transducer output.

30. A device, comprising:
a cantilever;
a piezoelectric transducer coupled to the cantilever to produce an electrical output signal in response to a vibration of the cantilever; and
an actuator situated to variably contact the cantilever to establish a resonant frequency of the cantilever;
wherein the actuator is an Ionic Polymer Metal Composite (IPMC).

31. A device, comprising:
a cantilever;
a piezoelectric transducer coupled to the cantilever to produce an electrical output signal in response to a vibration of the cantilever; and
an actuator situated to variably contact the cantilever to establish a resonant frequency of the cantilever;
wherein the actuator has a diamond shape and includes first and second actuators that are stacked.

32. A device, comprising:
a cantilever;
a piezoelectric transducer coupled to the cantilever to produce an electrical output signal in response to a vibration of the cantilever; and
an actuator situated to variably contact the cantilever to establish a resonant frequency of the cantilever;
wherein the actuator is a single layer ionic polymer metal fiber composite.

* * * * *